United States Patent [19]
Myers

[11] Patent Number: 5,205,756
[45] Date of Patent: Apr. 27, 1993

[54] CHIP CARRIER SOCKET

[75] Inventor: Bruce B. Myers, South Bend, Ind.

[73] Assignee: Wells Electronics, Inc., South Bend, Ind.

[21] Appl. No.: 826,968

[22] Filed: Jan. 28, 1992

[51] Int. Cl.$^5$ .......................................... H01R 13/629
[52] U.S. Cl. ...................................... 439/266; 439/526
[58] Field of Search ............... 439/266, 267, 378, 264, 439/526

[56] References Cited

U.S. PATENT DOCUMENTS

| 4,832,612 | 5/1989 | Grabbe et al. | 439/71 |
| 4,846,703 | 7/1989 | Matsuoka et al. | 439/266 |
| 5,114,358 | 5/1992 | Myers | 439/266 |

Primary Examiner—Gary F. Paumen
Attorney, Agent, or Firm—James D. Hall

[57] ABSTRACT

An IC carrier socket having a top with integrally molded guide pins for initially engaging and maintaining an IC carrier in the proper orientation and position during seating the carrier within the socket.

3 Claims, 3 Drawing Sheets

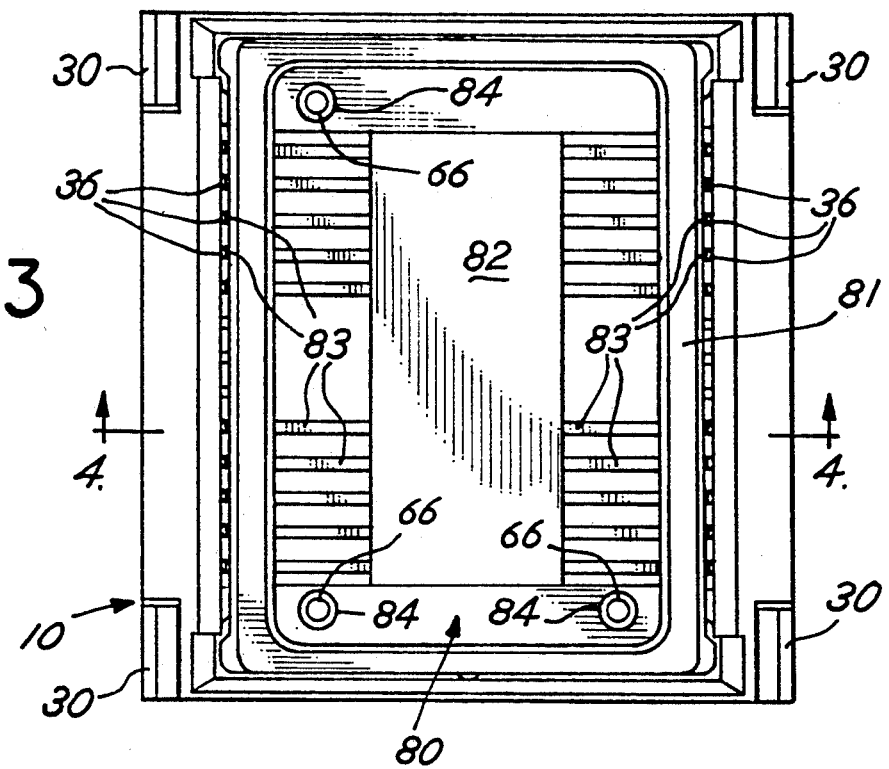
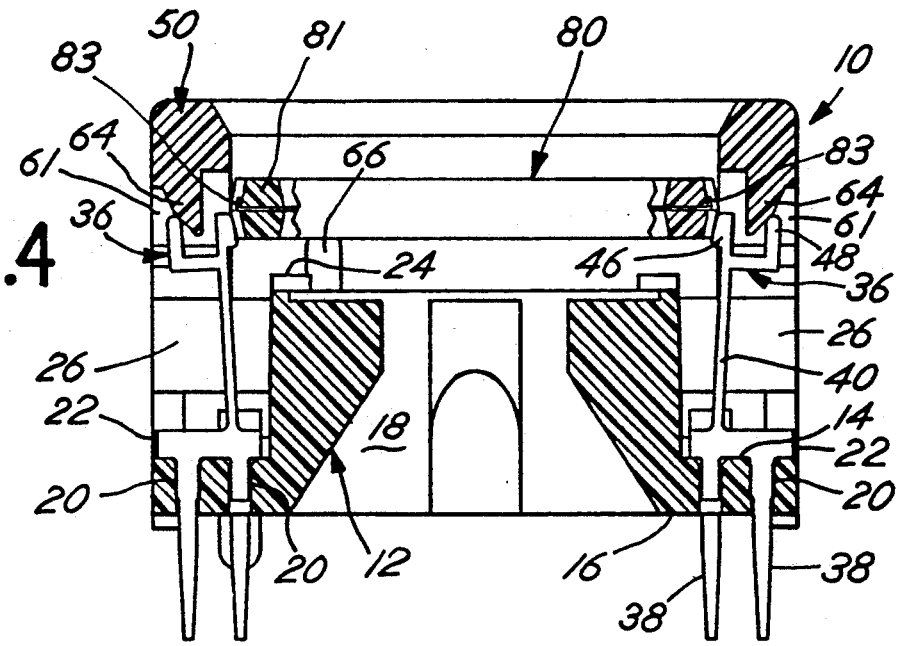

CHIP CARRIER SOCKET

SUMMARY OF THE INVENTION

This invention relates to a socket and will have special application to a carrier socket for an integrated circuit.

SUMMARY OF THE INVENTION

This invention relates to improvements in integrated circuits (IC) chip carrier sockets. An IC in its miniaturized form is made into a chip which is normally mounted to a carrier. Leads or pads extend from the carrier to provide electrical current to the chip. The carriers normally have included pin holes or indentations for insuring proper orientation and alignment in carrier sockets during testing and various other applications. Conventional carrier sockets have incorporated guide pins molded into the base members of the sockets. The guide pins orientate and align the IC carrier in the socket cavity during the downward movement of the top which can cause the carrier to shift laterally relative to the top as it nests within the base.

This invention provides for guide pins which are molded directly into the socket top. Such guide pins properly orientate and align the IC carrier inside the lid. Because the guide pins are molded into the moving socket top, the IC carrier continuously remains in proper alignment during its downward movement into the base cavity with the lid first serving to cam the socket contacts into their open position to seat the aligned carrier.

Accordingly, an objective of this invention is to provide a novel and improved carrier socket for use with IC carrier.

Another objective of this invention is to provide a carrier socket having carrier guide pins integrated into the socket top.

Another objective of this invention is to provide a carrier socket having a top for maintaining an IC carrier in proper orientation and alignment as it is seated in the socket base.

Other objectives of this invention will become apparent upon a reading of the following description.

BRIEF DESCRIPTION OF THE DRAWINGS

A preferred embodiment of the invention has been chosen for purposes of illustration wherein:

FIG. 3 is a top plan view of the socket with the carrier inserted.

FIG. 4 is a cross-sectional view of FIG. 3 taken along line 4—4 thereof, showing the carrier inserted into the socket but prior to seating.

DESCRIPTION OF THE PREFERRED EMBODIMENT

Figure 1:
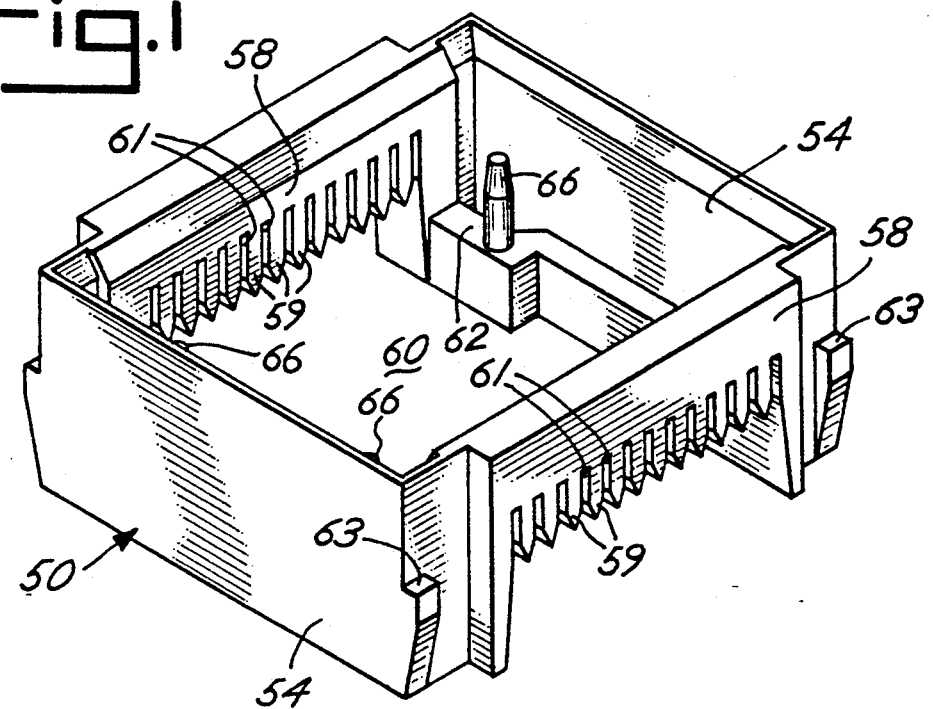
FIG. 1 is a perspective view of the top of the socket.
Figure 2:
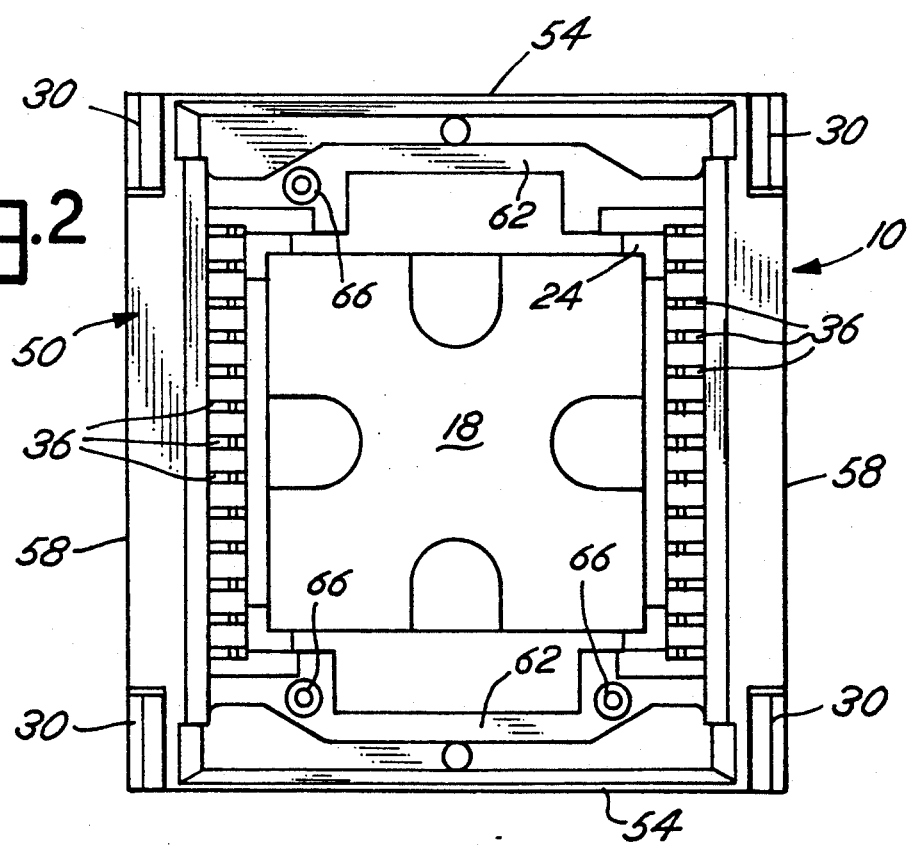
FIG. 2 is a top plan view of the socket.

The preferred embodiment herein described is not intended to be exhaustive or to limit the invention to the precise form disclosed. It is chosen and described to explain the principles, application and practical use of the invention and thereby enable others skilled in the art to utilize the invention.

The socket 10 shown in the drawings includes a base member 12 having a top face 14 and a bottom face 16. Base member 12 includes a central opening 18 and a plurality of peripheral bores 20 about opening 18 which extended through faces 14 and 16. A plurality of grooves 22 are cut in base member face 14 on two opposed sides. A raised table section 24 extends about central opening 18 and includes grooves 26 which are aligned with grooves 22. Base member 12 also includes two pairs of opposed finger latches 30 each of which is flexible and includes a lock tab.

Socket 10 also provides for a plurality of contacts 36. Each contact 36 is constructed of resilient electrically conductive material and is of the general cross-sectional configuration shown in FIGS. 4–6. Each contact 36 has lower leads 38 which extend through base member bores 20. The integral neck 40 of each contact 36 is fitted into aligned grooves 22 and 26. Each contact 36 includes an integral upper head having a bevelled chin part 46 offset from the contact's neck 40 as seen in FIG. 4 and an outwardly extending integral L-shaped arm 48.

Socket 10 includes a top 50 having the general configuration shown in FIG. 1. Top 50 includes opposite side walls 54, 58 and a central opening 60 to allow for the insertion of an IC carrier 80 into socket 10. Side walls 58 include aligned depending fingers 59 separated by slots 61. Within each slot 61 and forming a part of top 50 is an abutment part 64. Two recessed carrier platforms 62 extend on opposed sides of central opening 60. Guide pins 66 protrude upwardly from carrier platforms 62. In the shown preferred embodiment, one platform 62 has two guide pins while the opposite platform 62 has only a single guide pin 66. Shoulders 63 are formed on each side wall 58 at the corners with walls 54.

Top 50 is attached to base member 12 as follows. With contacts 36 positioned in grooves 22, 26 of base member 12 and with leads 38 extending through base member bores 20, top 50 is placed over and pushed downwardly upon base member 12 until finger latches 30 of the base member engage shoulders 63 to secure the top to the base member as shown and described in U.S. Pat. No. 4,623,208. Contacts 36 fit into top grooves 61 with each contact platform 48 bearing against a top abutment part 64 to urge the top into its upper position as seen in FIGS. 4 and 6.

Figure 5:
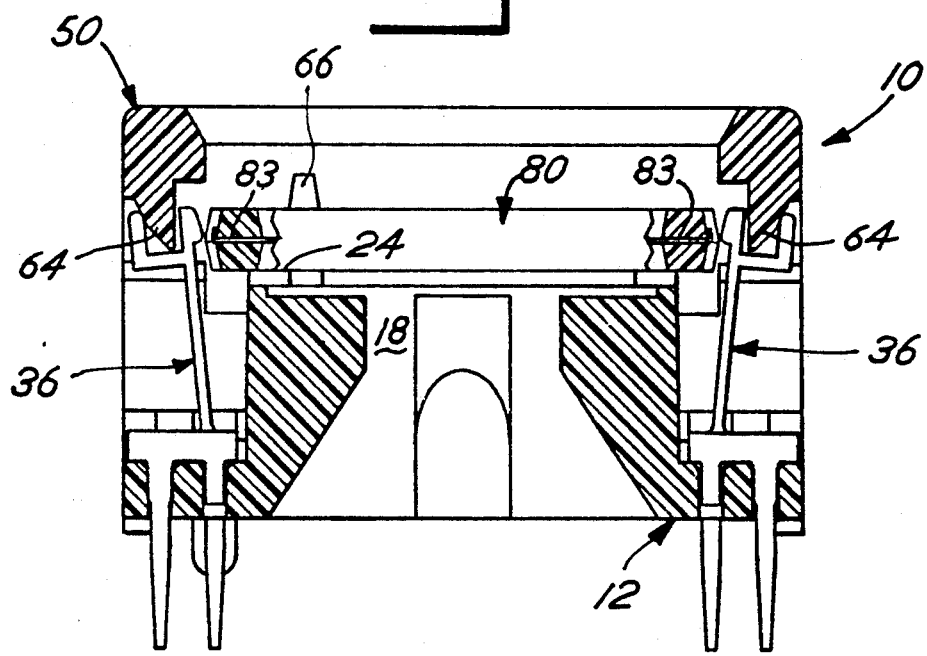
FIG. 5 is a cross-sectional view like FIG. 4 but showing the carrier initially seated within the socket and with the top of the socket in its fully depressed position.

One manner of operation of socket 10 is as follows. Top 50 is pushed downwardly towards base member 12 into its lower position as seen in FIG. 5. Abutment parts 64 urge contacts 36 outwardly, as seen in FIG. 5. This allows carrier 80 to be placed within top 50. Carrier 80 includes a frame 81 which encases a suspended IC 82 having leads 83. The IC leads 83 extend through frame 81. Holes 84 are formed in frame 81 to accommodate top guide pins 66. The three guide pins 66 accept guide holes 84 in IC carrier 80 as the carrier is placed into opening 60 of top 50. Pins 66 guide carrier 80 into the top between contacts 36 until the carrier seats upon base table section 23. With carrier resting upon base table section 24, top 50 is then released. Arm 48, under the influence of flexed contacts 36, urge the top upwardly away from base member 12 to allow contact chin parts 46 to compressively contact the leads or pads 83 of IC carrier 80 as shown in FIG. 6. IC carrier 80 can be released from clamping engagement with contacts 36 by pushing top 50 downwardly into its lower position, causing the spreading of contacts 36 away from the carrier.

Figure 6:
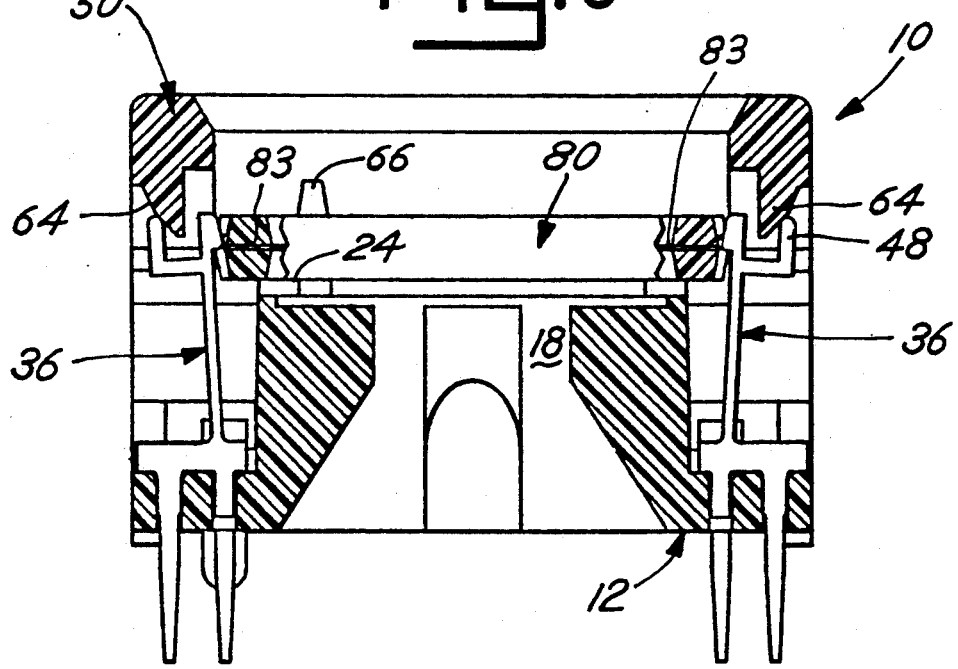
FIG. 6 is a cross-sectional view like FIG. 4 but showing the carrier seated in its operative position within the socket and with the top of the socket in its upper position.

Another manner of operation of socket 10 is shown sequentially in FIGS. 4-6. Carrier 80 is first placed into the center opening 60 of top 50 when the top is in its uppermost supported position (FIG. 4). The tips of lid guide pins 66 extend into the openings 84 formed in the frame 81 of the carrier. When in the position illustrated in FIG. 4, the carrier 80 is supported upon contacts 36 in an elevated orientation above table section 24 of the base. Upon depression of top 50 from its upper position shown in FIG. 4 into its lower position shown in FIG. 5, contacts 36 are flexed or pivoted outwardly, allowing carrier 80 to drop or fall onto table section 24 of the base as shown in FIG. 5. Top 80 is then released and under the influence or biasing action of contacts 36 is raised back up into its upper position with the contacts making engagement with the leads or pads 83 of carrier 80 as shown in FIG. 6. During its downward movement into the socket, carrier 80 is guided by pins 66 in alignment with contacts 36.

It is understood that the above description does not limit the invention to the embodiment herein described, but that it may be modified within the scope of the appended claims.

What I claim is:

1. A socket for an integrated circuit carrier, said socket including a base member and a movable top overlying said base, said base member having a central opening therein, a plurality of conductive resilient contacts for engaging said carrier, each contact anchored in said base member and including an upwardly extending part, said movable top having a central opening therein and including abutment means in contact with each contact part for moving and flexing said contacts in an outward direction relative to said base member opening upon movement of the top in a downward direction to space said contacts from said carrier and allow the insertion of the carrier into said socket, said top carrying upwardly extending guide pin means for protruding into said carrier to anchor and maintain the carrier in proper orientation relative to said top during said insertion of the carrier.

2. The socket of claim 1 wherein said top includes a platform, said guide pin means extending from said platform.

3. The socket of claim 2 wherein said guide pin means includes at least two upright pin members.

* * * * *